United States Patent [19]

Garvin et al.

[11] 4,049,944
[45] Sept. 20, 1977

[54] PROCESS FOR FABRICATING SMALL GEOMETRY SEMICONDUCTIVE DEVICES INCLUDING INTEGRATED COMPONENTS

[75] Inventors: Hugh L. Garvin, Malibu; Amnon Yariv; Sasson Somekh, both of Pasadena, all of Calif.

[73] Assignee: Hughes Aircraft Company, Culver City, Calif.

[21] Appl. No.: 606,373

[22] Filed: Aug. 20, 1975

Related U.S. Application Data

[63] Continuation of Ser. No. 336,679, Feb. 28, 1973, abandoned.

[51] Int. Cl.$^2$ .............................................. B23K 9/00
[52] U.S. Cl. ............................................ 219/121 EM
[58] Field of Search ................ 219/121 EB, 121 EM, 219/121 L, 121 LM; 250/423, 424, 492; 331/94.5 R; 350/320, 3.5

[56] References Cited

U.S. PATENT DOCUMENTS

| 3,340,377 | 9/1967 | Okazaki et al. ........ 219/121 EM X |
| 3,623,798 | 11/1971 | Sheridon .............................. 350/3.5 |
| 3,705,060 | 12/1972 | Stork ........................ 219/121 EB X |
| 3,860,783 | 1/1975 | Schmidt et al. .............. 219/121 EM |

FOREIGN PATENT DOCUMENTS

| 451,332 | 5/1968 | Switzerland .................. 219/121 EB |

OTHER PUBLICATIONS

"Efficient Wire-Grid Duplexer Polarizer for $CO_2$ Lasers," P. K. Cheo et al., Applied Physics Letters, vol. 18, No. 12, pp. 565-567, 6-1971.

"Thin-Film Distributed-Feedback Laser Fabricated by Ion Milling", D. P. Schinke et al., Appl. Phys. Lett., vol. 21, No. 10, 8-1972.

Primary Examiner—J. V. Truhe
Assistant Examiner—Fred E. Bell
Attorney, Agent, or Firm—William J. Bethurum; W. H. MacAllister

[57] ABSTRACT

Disclosed is a process for fabricating small geometry electronic devices, including a variety of integrated optical devices. The process includes the steps of holographically exposing a resist masking layer to a plurality of optical interference patterns in order to develop a masking pattern on the surface of a semiconductive body. Thereafter, regions of the body exposed by openings in the masking pattern are ion beam machined to thereby establish very small dimension undulations in these regions. These closely spaced undulations have a variety of uses in optical devices as will be described. The present invention is not limited to the geometry control of semiconductive structures, and may also be used in the geometry control of metallization patterns which have a variety of applications, or the geometry control of any ion beam sensitive material.

9 Claims, 15 Drawing Figures

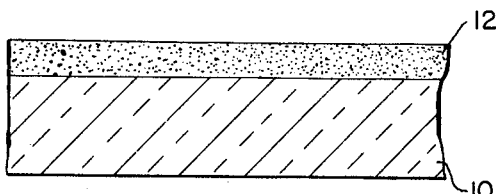
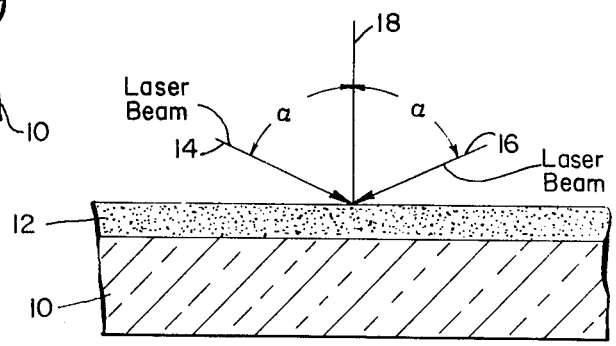
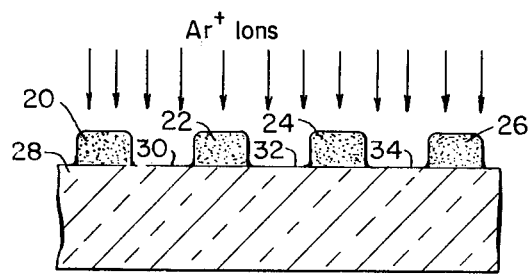
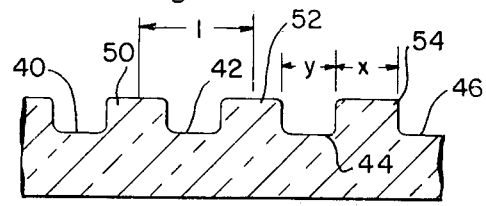
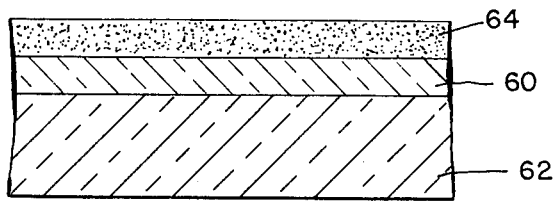
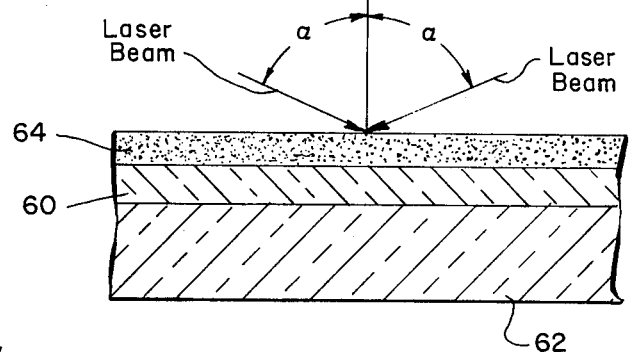
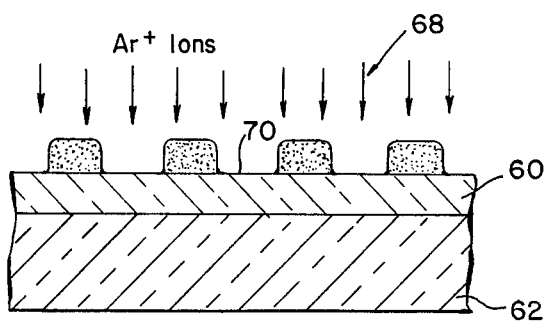

PROCESS FOR FABRICATING SMALL GEOMETRY SEMICONDUCTIVE DEVICES INCLUDING INTEGRATED COMPONENTS

This is a continuation of application Ser. No. 336,679, filed Feb. 28, 1973 now abandoned.

FIELD OF THE INVENTION

This invention relates generally to processes for controlling the small geometry dimensions of a variety of ion beam sensitive structures and more particularly to such processes utilizing the holographic exposure of ion beam masking patterns. The present process may be used in the formation of a variety of sub-micron optical devices, and the term "small geometry" does not refer to the overall size of the structure formed, but rather to the spacing between the closely spaced corrugations or undulations on the surface of the structure processed.

BACKGROUND

Recently there has been great interest in the field of integrated optics, which field includes the fabrication of a variety of optical devices from certain semiconductive materials, such as gallium arsenide. Gallium arsenide has an energy bandgap which is suitable for the transmission of light wavelengths greater than approximately 9000A, and this material is therefore of substantial interest in the fabrication of a variety of integrated light propagating structures. These structures include such optical components as light guides, light modulators, directional couplers, optical polarizers, and other similar devices. A general discussion of this subject may be found in a published article entitled "Integrated Optics — An Introduction" by S. E. Miller in the Bell System Technical Journal (BSTJ) September 1969, Vol. 48, pages 2059-2069.

PRIOR ART

Various processes have been used in the past in the fabrication of these optical components, and these processes make use of standard photolithographic masking techniques to define and control the surface geometry of the semiconductive material in which the above components are fabricated. Such conventional photolithographic masking processes have been used, for example, with other standard semiconductor fabrication techniques including diffusion, ion implantation, and various forms of etching in order to specifically define certain device active regions and to establish the overall geometry of the device being constructed. These processes provide, among other things, the total or partial optical isolation of certain channels in these devices in which the propagation of light is to be sustained and confined.

While the above prior art processes have proven satisfactory in the fabrication of certain types of optical components, they have not been totally satisfactory in the fabrication of certain very small geometry optical structures. One of the reasons for the latter is a result of the fact that the standard photomasking and exposure techniques employed in these prior art processes are limited in their geometry reduction capability. That is, there is a limit to the device geometry reduction attainable using state-of-the-art photolithographic masking processes, such as the ultraviolet exposure and mask pattern development of standard photoresists. These include the negative resists such as Kodak's metal etch resist (KMER) or Kodak's thin film resist (KTFR), or the Azoplate positive resists distributed by the Shipley Corp. of Newton, Massachusetts.

THE INVENTION

The general purpose of the present invention is to provide a new and improved process for fabricating small geometry semiconductor structures, including those of the type described above, which possesses all of the advantages of similarly employed prior art fabrication processes and yet simultaneously features a geometry reduction capability heretofore unattainable in the prior art as known to us. To attain this purpose, we have discovered a novel process which includes the deposition of a standard photoresist layer on the surface of a semiconductor body and the exposure of this layer to a series of optical interference patterns. The latter step prepares the layer for the subsequent development of same in a desired photoresist masking pattern. Thereafter, the semiconductor body and photoresist mask thereon are exposed to an ion beam machining (etching) process wherein ion beams partially sputter or etch away regions of the body exposed by openings in the previously formed photoresist masking pattern. This process produces a semiconductor surface having a plurality of closely spaced mesa-type regions (also referred to as corrugations or undulations) which are geometrically suitable for use in optical structures such as grating couplers, light waveguides, and the like. These structures exhibit a high quality edge smoothness, and the above process is characterized by a high resolution pattern formation with very small line widths. As mentioned, the above process is also useful in the fabrication of metal masks which are then suitable either for use as high energy ion implantation masks or as wire grid polarizers.

Accordingly, an object of the present invention is to provide a new and improved process for closely controlling the dimensions of a wide variety of small geometry solid semiconductor structures.

Another object of the present invention is to provide a novel process of the type described which is particularly suited for the fabrication of a wide variety of small geometry integrated optical structures, such as those mentioned above.

Another object is to provide a new and improved process of the type described which may be carried to completion in a minimum number of individual process steps and which steps lend themselves to the close control of the dimensions of the structure being processed.

A feature of the present invention is the provision of a process for micromachining solids which may be utilized in producing corrugations or undulations in any solid material with a suitable ion beam etch rate and upon which a desired ion beam resistant masking pattern may be formed.

Another feature of the present invention is the provision of a fabrication process which utilizes a minimum of individual process steps in the establishment of a photomask pattern which is subsequently used to control the exact geometry and dimensions of semiconductive devices being fabricated.

Another feature of the present invention is the provision of a fabrication process capable of producing high resolution patterns, such as very fine grating patterns, which may be etched into any large-area surface of a substrate or a film material to which photoresist may be applied.

A further feature of the present invention is the Provision of a fabrication process of the type described which does not require the chemical etching of the structure being processed.

Another feature of the present invention is the provision of a fabrication process which utilizes ion beam machining (also referred to as ion beam sputtering or etching) which is a slow and thus easily controlled and monitored process capable of producing exact etch depths and profiles in an undulated surface.

A further feature of the present invention is the provision of photoresist exposure and development technique wherein the angle of incidence of laser beams directed onto the photoresist layer may be varied to control the optical interference patterns thereon and thus the geometry of the photoresist mask pattern formed.

A further feature of the present invention is the provision of a fabrication process of the type described in which the angle of incidence of the sputtered ion beam used in machining the structure may be varied to whereby change the profile of the pattern etched in the target surface and thus controlled to be either rounded, smooth, or blazed as required.

A still further feature of the present invention is the provision of a fabrication process of the type described which readily lends itself either to the fabrication of metal masks to be used with subsequent semiconductor processing or the fabrication of metal grids which, per se, have utility as wire grid polarizers or the like.

These and other objects and features of the invention will become more readily apparent in the following description of the accompanying drawings wherein:

DRAWINGS

FIG. 1 is a diagrammatic cross-section view of an initial photoresist process step of a first process embodiment of the invention;

FIG. 2 illustrates the holographic laser beam exposure of the photoresist layer in FIG. 1;

FIG. 3 illustrates the developed masking pattern in the photoresist layer previously exposed in FIG. 2 and the subsequent ion beam machining of the underlying substrate therein; and FIG. 4 illustrates, in diagrammatic cross-section view, the ion beam-etched undulations which are closely spaced in the substrate. The structure in FIG. 4 has separate utility as an optical coupler, or it may be further processed to form a ridged waveguide.

Figure 8:
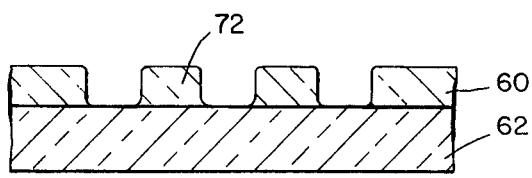
Figure 9:
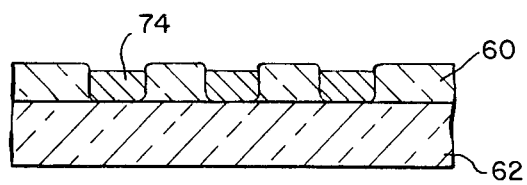
Figure 10:
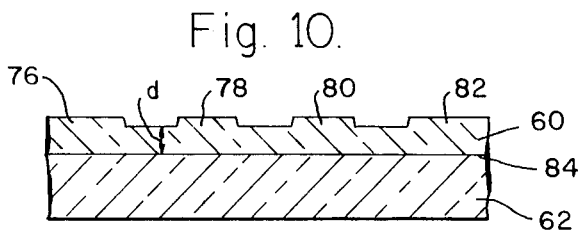

FIG. 5 illustrates, in diagrammatic cross-section view, an initial step of a second process embodiment of the invention which utilizes either an intermediate epitaxial layer or an intermediate ion implanted light guiding layer therein;

FIG. 6 illustrates the laser beam exposure of the photoresist layer of FIG. 5;

FIG. 7 illustrates the photoresist mask pattern formed on the surface of the light guiding layer and the subsequent ion beam machining of the exposed regions of this light guiding layer;

FIG. 8 illustrates one resultant ridged waveguide geometry which may be achieved by ion beam machining the structure in FIG. 7;

FIG. 9 illustrates an extension of the geometry in FIG. 8 wherein an optical coupling material is provided between the isolated ridged waveguides in FIG. 8; and FIG. 10 illustrates another modification of the structure of FIG. 8 wherein the mesa-shaped optical channels therein are not totally isolated on from another, thereby permitting some optical coupling between adjacent light guides.

Figure 11:
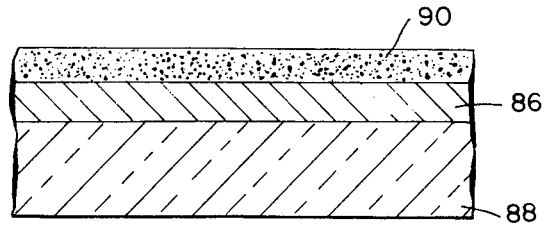
Figure 12:
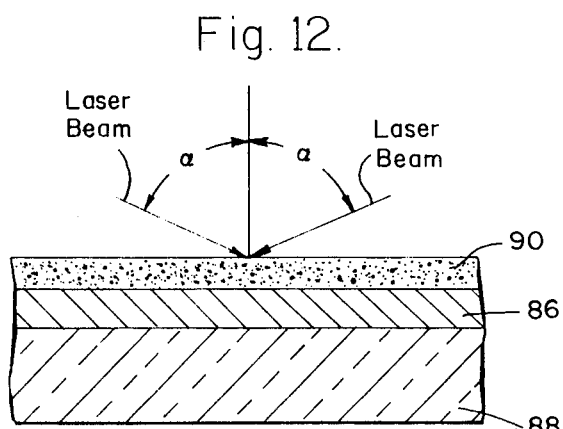
Figure 13:
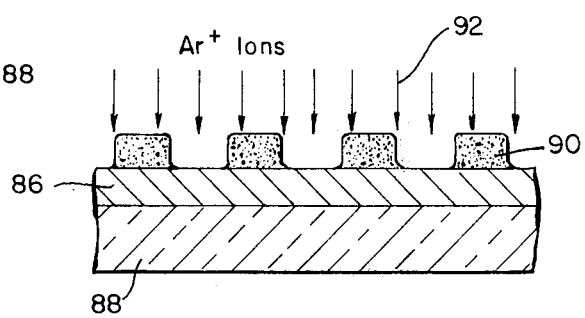
Figure 14:
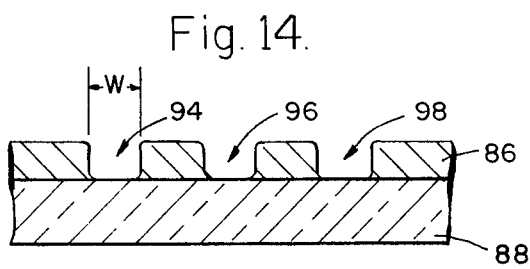

FIG. 11 illustrates, in diagrammatic cross-section view, an initial photoresist step in yet another process embodiment of the invention wherein a metal mask is ion beam machined;

FIG. 12 illustrates the laser beam exposure of the photoresist layer in FIG. 11;

FIG. 13 illustrates the developed photoresist masking pattern on the surface of the structure and the ion beam etching of the exposed portions of the underlying layer of metallization;

FIG. 14 illustrates the ion beam machined pattern in the metallization layer of FIG. 13 to form a metal mask which, per se, has utility as an optical wire grid. In this instance the final structure of the process embodiment is that of FIG. 14.

Figure 15:
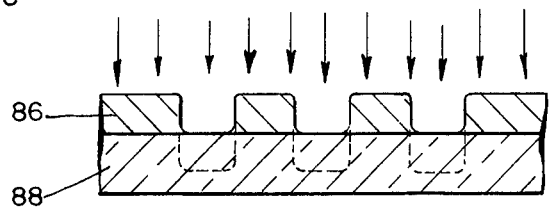

FIG. 15 illustrates a further extension of the process illustrated in FIGS. 11–14 and the utilization of the previously formed metal mask of FIG. 14 as an ion implantation barrier against high energy particles. These particles may, for example, be high energy protons which may be implanted through openings in the metal mask and into the underlying substrate material.

GENERAL DESCRIPTION OF THE VARIOUS PROCESS EMBODIMENTS

Referring now to FIG. 1, there is shown a substrate 10 of suitable semiconductive material, such as gallium arsenide (GaAs), upon which a photoresist layer 12 is deposited using known semiconductor processing techniques. GaAs has a bandgap energy on the order of 1.4 eV which is sufficiently high to efficiently sustain light propagation on the order of 9000Å wavelength or greater. The photoresist layer 12 may be Kodak's metal etch negative resist (KMER) or Kodak's thin film negative resist (KTFR), each which is commercially available at the Kodak Company of Rochester, New York. Alternatively, one of the positive photoresists available from the Kodak Co. or from the Shipley Corp. of Newton, Massachusetts may be used in the formation of layer 12.

Once the photoresist layer 12 is sufficiently dry, this entire layer is exposed to a pair of coherent laser beams 14 and 16 as shown in FIG. 2 which are incident thereon from a common source (not shown). Each laser beam arrives at the layer 12 at an angle $\alpha$ as shown with respect to a line 18 perpendicular to the plane of the photoresist layer 12. The wave fronts of the two laser beams 14 and 16 which arrive at the surface of the photoresist layer 12 are coherent relative to each other, and this may be accomplished by using known optical processing techniques wherein a beamsplitter is utilized to process laser beams projected from a single laser source. The optical interference patterns produced by the interaction of the two laser beams 14 and 16 in turn produce alternate light and dark areas on the surface of the photoresist layer 12 which serve to expose this layer in a plurality of alternate parallel (or nearly parallel) strips. These exposed strips will withstand the subsequent development of the photoresist layer 12 to remove the intermediate unexposed regions of the layer 12 beneath the dark areas of the resist layer, assuming a "negative" photoresist is used. A suitable etchant such as xylene may be used to remove the unexposed portion of the photoresist layer 12. This photoresist and etching process per se is well-known in the art and will not, therefore, be described in further detail herein.

The above film development process produces the resultant photomasked structure illustrated in FIG. 3, including the photoresist pattern consisting of a plurality of smooth edged regions 20, 22, 24 and 26 between which lie the exposed areas 28, 30, 32 34 and 36 of the upper surface of the substrate 10. The photoresist regions 20, 22, 24 and 26 have their centers spaced apart a distance $d = \lambda/2 \sin \alpha$, where $\lambda$ is the wavelength of the laser beam used to develop the photoresist layer and $\alpha$ is the angle of incidence indicated in FIG. 2 above.

The areas 28, 30, 32, 34 and 36 of the underlying GaAs substrate 10 are exposed to an energetic beam of argon (AR+) ions 38 as shown in FIG. 3 which serve to etch the cavities 40, 42, 44 and 46 in the geometry shown in FIG. 4. These cavities are formed beneath the substrate areas exposed in FIG. 3 and thus they form a series of undulations or corrugations in the surface of the substrate 10.

The optical structure shown in FIG. 4 has utility per se as a grating coupler which may advantageously be utilized as an integral part of another optical channel (not shown) and for coupling light into this channel, as is well-known. When the undulations 40, 42, 44, 46 and 48 and their adjacent mesas 50, 52, 54 and 56 are sufficiently closely spaced and positioned to receive incident light focussed onto the upper surface of FIG. 4, the diffraction of the incident light will be so dispersed and reflected between adjacent mesas that some of the light will be coupled through the upper surface of FIG. 4 and into another optical structure (not shown) to which the substrate 10 of FIG. 4 may be integrally joined or otherwise optically coupled.

An alternative application for the structure in FIG. 4 is that of an optical filter which may be made an integral part of a thin-film optical waveguide. If the spacing between corrugations is proper, the corrugated surface will reject those frequencies for which the period is equal to an integer $n$, (1, 2, 3, etc.) times the half-wavelength. That is, the dimension $d = n \cdot \lambda/2$. In the latter application, the corrugated surface should be positioned in a thin film waveguide so that it is directly exposed to the propagated light waves.

Another alternative application for the structure FIG. 4, and one which has a separate and distinct utility from those described above, is that of a ridged waveguide having a plurality of parallel optical chanels 50, 52, 54 and 56 as shown through which light may be propagated in a direction normal to the plane of the cross-section of FIG. 4. This latter channel needs to be optically isolated, of course, as will be more fully described below with reference to FIGS. 8, 9 and 10.

Referring now to FIG. 5, there are illustrated the initial process steps of a second process embodiment of the invention wherein an intermediate light guiding layer 60 is formed on or in the underlying substrate material 62. This guiding layer 60 may be an epitaxial extension of the substrate 62, or it may be formed by ion implantation into the substrate 62 to thus establish the interface or boundary 64 between these two regions of optical material having different indices of refraction. As mentioned above, GaAs is a suitable optical material for both of these regions 60 and 62, and advantageously the region 60 may be a relatively high resistivity proton implanted region in a relatively low resistivity GaAs substrate 62. Thus, the boundary 64 may be utilized as a light reflective interface as will be described to confine the light propagated within the structure to the layer 60.

A photoresist layer 64 of the type described above is deposited as shown on the upper surface of the light guiding layer 60. The photoresist layer 64 is exposed, developed and processed as illustrated in FIG. 6 and FIG. 7 in a manner identical to the development and processing of the photoresist layer 12 in the previously described process embodiment of the invention. Thus, the laser beam development process step illustrated in FIG. 6 corresponds identically to the laser beam process step illustrated in FIG. 2, whereas the resist pattern etching and subsequent ion beam machining illustrated in FIG. 7 corresponds identically to the etching and machining process illustrated in FIG. 3 above. However, in the present process, the argon (Ar+) ion beam 68 as shown in FIG. 7 is now utilized to machine into the exposed regions 70 of the intermediate light guiding layer 60. The ion beam machining step illustrated in FIG. 7 may, for example, be utilized to etch completely through this intermediate layer leaving the optically isolated parallel channels 72 as illustrated in FIG. 8. This structure is sometimes referred to as a ridged waveguide and light is propagated in the channels 72 in a direction normal to the plane of the cross-section of FIG. 8. Each of these channels 72 is bounded on all sides by materials (including air) having indices of refraction lower than the GaAs channel material, and this feature serves to confine the propagated light to each of these channels. There will, of course, be some light loss and the amount of such loss and thus the measure of coupling efficiency is dependent upon the differences in refractive indices between the channel material and the materials bounding the channel. If the channel 72 is air isolated as shown in FIG. 8, but if a material with a different index of refraction is desired, then a suitable dielectric or semi-insulating material 74 may be deposited between adjacent channels as illustrated in FIG. 9. This variation in the optical isolation material 74 between adjacent channels may be desired in applications where electro-optical coupling between adjacent channels is desired. In such an application, GaAs may be used as the isolation material 74, with a doping level such that its refractive index is slightly lower than that of the guiding layer.

It is sometimes desirable to provide a plurality of parallel mesa-like channels 76, 78, 80 and 82 as shown in FIG. 10 which are not completely optically isolated but rather are only partially isolated one from another and thus permit some degree of optical coupling between adjacent channels. If such a structure is preferred, then the process embodiment illustrated in FIGS. 5–7 may be utilized in fabricating the resultant structure of FIG. 10. This is accomplished by ion beam machining down to a depth less than the boundary 84 between the light guiding layer 60 and its underlying substrate 62. The exact spacing "d" as shown in FIG. 10 may be controlled in accordance with the particular application of the optical waveguide structure being fabricated, and such control is, of course, within the skill of the art.

The present inventive process is not limited to the production of corrugations or undulations in semiconductive materials, and in addition it may be employed to ion beam machine desired geometries in any ion beam sensitive substrate material with a suitable etch rate and to which a photoresist layer or other like masking material may be suitably applied. For example, the present inventive process may be utilized to machine metal layers in order to form various types of structures, such as metal grid polarizers or metal masks which may be subsequently utilized as barriers in selective high energy ion implantation processes. Such exemplary fabrication processes are illustrated in FIGS. 11 through 15, wherein a layer 86 of suitable metallization, such as chromium-gold, is deposited on the upper surface of a GaAs semiconductive substrate 88. Subsequently, a layer of photoresist 90 is applied to the upper surface of the metallization layer 86, and then the photoresist layer 90 is dried, exposed, processed and developed as illustrated in FIGS. 12 and 13 in a manner identical to the processing and development of the photoresist layers in FIGS. 2 and 6 of the previously described process embodiments.

Next, the metal layer 86 is bombarded as shown in FIG. 13 with an argon ion beam 92 which is of sufficiently high energy to machine out the regions 94, 96, 98 and 100 of the metal mask 86 as shown in FIG. 14. The line widths W of these etched out regions of the metal layer 86 are the same distance $d = \lambda/2 \sin \alpha$ as previously indicated, and this distance is typically on the order of 0.8-3.0 microns for the polarization of infrared radiation. Thus, the metal layer 86 in FIG. 14 may be utilized as a wire grid polarizer through which light of only a selected polarization will pass through these fine line openings 94, 96, 98 and 100. Therefore, the structure FIG. 14 has a separate and distinct utility in and of itself when used as a wire grid polarizer as described.

On the other hand, however, the metallized structure of FIG. 14 may be further used in an alternative process embodiment of the invention wherein the metal mask 90 serves as a partial barrier to high energy particles which are selectively implanted therethrough shown in FIG. 15. The structure in FIG. 15 is particularly useful with very high energy particle bombardment processes, such as the proton bombardment of gallium arsenide substrates in the fabrication of deep implanted structures. Such proton bombardment may be used to either dope these semiconductive structures to a desired carrier concentration or to otherwise modify the carriers therein, such as forming defect centers in the GaAs structure. Dielectric masks such as silicon dioxide, or photoresist masks per se have proven unsuitable for use as high energy barriers to such proton bombardment at particle energies typically on the order of 300 KeV.

Thus, the structure of FIG. 15 has a significant utility in these latest state-of-the-art high energy particle bombardment processes. Such processes are also useful, for example, in the formation of defect centers in the underlying gallium arsenide substrate material 88, and these centers enable the GaAs to serve as both an optical wave guiding material with one bandgap energy and also as a light detector material of another lower bandgap energy which results from the formation of these defect centers during particle bombardment. Thus, using the above process the structure of FIG. 15 can be so configured as to have the GaAs optical waveguiding material and the GaAs light detector material on a common substrate and even integrally joined therein. Furthermore, the GaAs light emitting source (PN junction) can also be fabricated on this same GaAs substrate so that in a single continuous GaAs channel one may provide the PN junction light emitter, an optical GaAs waveguide coupler for transmitting the emitted light to a remote point, and then GaAs light detector at this remote point to detect the amplitude of the received light. When using GaAs infrared emitting PN junctions, this "light" of course is infrared radiation.

In practicing the present invention and using GaAs, we have been able to obtain surface corrugations with spacings much smaller than it is possible to obtain using any known prior art processes. For example, using our process, the corrugations in the structure of FIG. 4, when configured as a grating coupler, may be spaced with a period 1 of between 0.12 microns and 1.0 microns and a corresponding ridge top or line width, X, from between 0.06-0.5 microns.

If the structure of FIG. 4 is fabricated as a waveguide of parallel channels, then the spacing "Y" can be made as small as 1.0-2.0 microns.

If the above process is used for fabricating a wire grid polarizer as illustrated in FIG. 14, then the distance W can be machined in the range of 0.1-0.4 microns. The period of this structure will be on the order of 0.8-3.0 microns for a surface area of approximately 1 square centimeter.

It should be understood that the above-described inventive processes are not to be limited to any particular materials, such as the particular GaAs light propagating material or the particular type of metallization system used. Furthermore, various types of positive and negative photosensitive resists may be used instead of those specifically disclosed.

What is claimed is:

1. A process for controlling the surface geometry of a substrate of ion beam-sensitive material including the steps of:
    a. forming a resist layer on a surface of said substrate of said material;
    b. exposing said resist layer to controlled optical interference patterns, whereby selected regions of said resist layer may be removed thereby leaving a resist mask on the surface of said substrate; and
    c. exposing said substrate and mask thereon to an ion beam for machining and partially etching away exposed regions of said substrate, whereby very fine line widths may be achieved for these etched regions and a very high resolution may be obtained in said process while simultaneously minimizing the temperatures to which said substrate and mask are subjected during said process.

2. The process as defined in claim 1 wherein the exposure of said resist mask includes projecting a plurality of laser beams of a predetermined wavelength onto said resist layer at a predetermined angle with respect to the plane of said layer, whereby the optical interference of said beams causes exposure of said resist with a predetermined variation across the surface of said resist layer, and said angle may be varied to in turn vary the exposure pattern of said resist layer and the line widths of the resist mask formed therefrom.

3. The process defined in claim 2 which includes projecting a pair of laser beams from a common source onto the surface of said resist layer and causing an exposure of said resist layer with a sinusoidal variation across the surface thereof at a period of $D = (\lambda/2) \sin \alpha$, where $\alpha$ is the angle that said beams make with respect to a line perpendicular to the plane of said resist layer.

4. The process defined in claim 1 wherein the formation of said resist layer includes depositing a photoresist layer on a gallium arsenide substrate, whereby mesa-like channels may be formed in said gallium arsenide substrate during the controlled ion beam etching thereof, and the light propagation in said channels may be sustained as a result of the desired bandgap energy of said gallium arsenide.

5. The process as defined in claim 1 wherein the formation of said resist layer includes depositing a photoresist layer on the surface of a substrate layer of metallization, whereby selected regions of said metallization may be ion beam etched away to expose the material underlying said metallization and enabling said metallization to serve either as a mask against subsequently implanted high energy particles or as a metal grid of a desired machined geometry.

6. The process defined in claim 1 wherein said ion beam sensitive material is a light propagation layer of semiconductive material which has either been epitaxially deposited or ion beam formed as a surface layer of a larger substrate material, so that the boundary of said larger substrate layer and said light propagating layer may be utilized to confine the light propagated in certain portions of said layer after channels have been formed in the latter.

7. The process defined in claim 6 which includes ion beam machining said light propagating layer down to a depth at least that of the boundary between said light propagating layer and the underlying substrate to thereby form a plurality of individual parallel light propagating channels.

8. The process defined in claim 6 which includes ion beam machining said light propating layer to a depth less than that of the boundary between said light propagating layer and its underlying substrate, whereby light intercoupling between parallel channels formed in said light propagating layer may be achieved.

9. The process defined in claim 7 wherein strips of optical coupling material are disposed between adjacent parallel channels and more closely match the refractive index of the channel than does air, whereby the specific refractive index of said coupling material may be selected in accordance with the desired electro-optical coupling between adjacent waveguide channels.

* * * * *